United States Patent [19]
Maurin et al.

[11] Patent Number: 5,811,798
[45] Date of Patent: Sep. 22, 1998

[54] SEALED PHOTOELECTRIC DETECTOR

[75] Inventors: Jacques Maurin, deceased, late of Cognac, By Stéphane Maurin, heir; Karine Maurin, Gensac-La-Palue, both of France

[73] Assignee: Schneider Electric SA, Boulogne Billancourt, France

[21] Appl. No.: 791,060

[22] Filed: Jan. 28, 1997

[30] Foreign Application Priority Data

Feb. 5, 1996 [FR] France ................................. 96 01468

[51] Int. Cl.⁶ .................................................. H01J 5/16
[52] U.S. Cl. ............................................. 250/239; 250/216
[58] Field of Search ............................... 250/239, 216, 250/573, 574, 577; 359/507, 511, 513

[56] References Cited

U.S. PATENT DOCUMENTS

| | | | |
|---|---|---|---|
| 3,870,878 | 3/1975 | Walter et al. | 250/239 |
| 4,055,761 | 10/1977 | Shimomura | 250/239 |
| 5,115,129 | 5/1992 | Johnson | 250/239 |
| 5,200,607 | 4/1993 | Klima | 250/239 |
| 5,326,968 | 7/1994 | Johnson et al. | 250/239 |

FOREIGN PATENT DOCUMENTS

| | | |
|---|---|---|
| 2 385 268 | 10/1978 | France . |
| 92 13 774.1 | 1/1993 | Germany . |
| 2 056 660 | 3/1981 | United Kingdom . |

*Primary Examiner*—Edward P. Westin
*Assistant Examiner*—John R. Lee
*Attorney, Agent, or Firm*—Oblon, Spivak, McClelland, Maier & Neustadt, P.C.

[57] ABSTRACT

Photoelectric detector equipped with a centering support of optical components.

The centering support 30 is a part in elastomer fitted externally with a flexible element 39 against which the internal tubular wall of a lens optical part 20 is applied and sealed, and adjusted by resilience on the optical components 16,17.

4 Claims, 1 Drawing Sheet

SEALED PHOTOELECTRIC DETECTOR

This invention relates to a photoelectric detector comprising, in a casing, an electronic circuit on one edge of which is fixed at least one transmitter or receiver optical component of determined optical axis.

Such receivers are well known, comprising a printed circuit, a transmitter optoelectronic component and a receiver optoelectronic component soldered to the printed circuit, together with a centering support of these two components, which said support is equipped with a tubular external surface so as to be housed in the casing, and at least one internal housing of a general cylindrical or cylindro-conic shape in which the components are positioned.

For the purposes of producing a collimation of the beam emitted by the detector and of the beam reflected by the target and the sight, an optical part comprising lenses is usually fitted; this optical part has a frontal wall fitted with lenses centered on the optical axes of the components and may be fitted in front of the centering support or may envelop this support by means of a tubular wall. When tubular, the optical part is itself assembled to a tubular casing which forms the outer envelope of the detector; this assembly is achieved by stopping a rim of the optical part against the edge of an open extremity of the tubular casing.

It is also known that, during the fabrication of the detector, the casing is filled inside with curable resin so as to make the detector less sensitive to alterations due to its environment, in particular shocks and vibrations. As there are always filling discontinuities in the casing, it is advisable to ensure that the inner volume of the casing is properly sealed from the exterior. A known means for this purpose is to place a sealing joint in a gap of the support of the optical components or of the tubular optical part so as to seal its bond with the neighboring part of the detector or to fix these elements to each other or to the casing by gluing.

This invention aims to provide a satisfactory sealing in a photoelectric detector of the type described by means of arrangements.

The invention relates to a photoelectric detector comprising, in a casing, an electronic circuit on one edge of which is fixed at least one transmitter or receiver optical component of determined optical axis, and an optical unit including firstly a centering support of the component, which said support is equipped with at least one internal housing for the component, and secondly an optical part comprising a tubular wall surrounding the support and a frontal wall equipped with at least one lens centered on the optical axis of the component.

According to the invention, the centering support of the component is a part molded in elastomer including on its external surface a flexible sealing flange created by molding and applicable against the internal surface of the tubular wall of the optical part. The elastomer part is preferentially adjusted, without glue or joint, on the optical component(s) by means of its own resilience.

The flexibility of the centering support of the components and the presence of the flange stops the flow of resin between the support of the components and the optical part during the fabrication of the casing and prevents water and humidity from penetrating the casing when the detector is used.

The following description of an example of the invention, with reference to the accompanying drawings, explains the advantages and results obtained from the invention.

Figure 1:
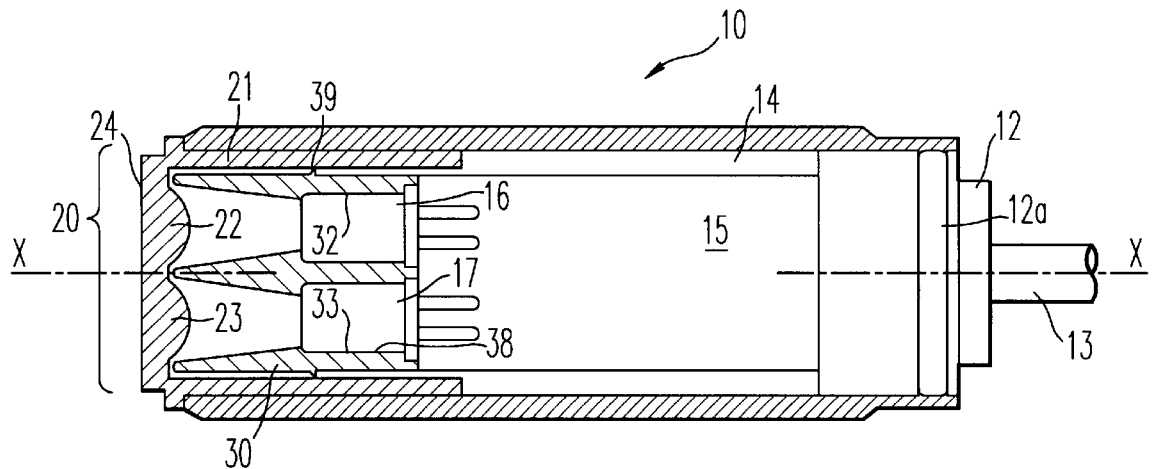
FIG. 1 represents in lateral elevation a photoelectric detection according to the invention.
Figure 2:
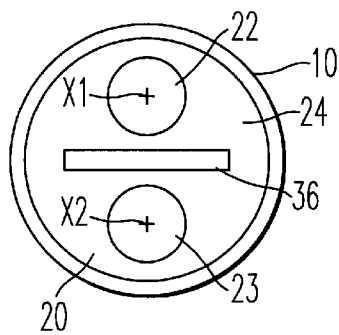
FIG. 2 is a front elevation of the detector of FIG. 1.

The photoelectric detector illustrated in the figures includes a casing 10 in plastic or metallic material threaded externally in 11 in order to be fitted into a threaded carrying mechanism. The casing 10 has a cylindrical or prismatic form and is closed towards the front by a transparent optical part 20 which will be described at a later stage, and towards the rear by a cap 12 which is equipped with a sealing joint 12a and which allows the passage of a connection cable 13. An electronic circuit is housed in the inner volume 14 of the casing, said circuit being implemented by means of a printed circuit 15 which is connected at the rear to the cable 13 and at the front to two optical components, namely a transmitter optical component 16 and a receiver optical component 17 having optical axes X1 and X2 parallel or approximately parallel to an axis X; this axis X is here the longitudinal axis of the cylindrical casing.

An optical unit is placed at the front of the detector; it is made up of an optical part 20 and a centering support 30 of the component. The support 30 is placed in the volume 14 and towards the front in order to house the components 16,17 and thus to define correctly the direction of their optical axes X1, X2. The centering support 30 comprises a tubular body 31, which is cylindrical in this example but which may also be prismatic, and two internal housings 32,33 in which the components 16,17 are sealed. The housings 32,33 open towards the front of the support via openings 34,35 of a generally flared shape, separated by a wall 36.

Figure 3:
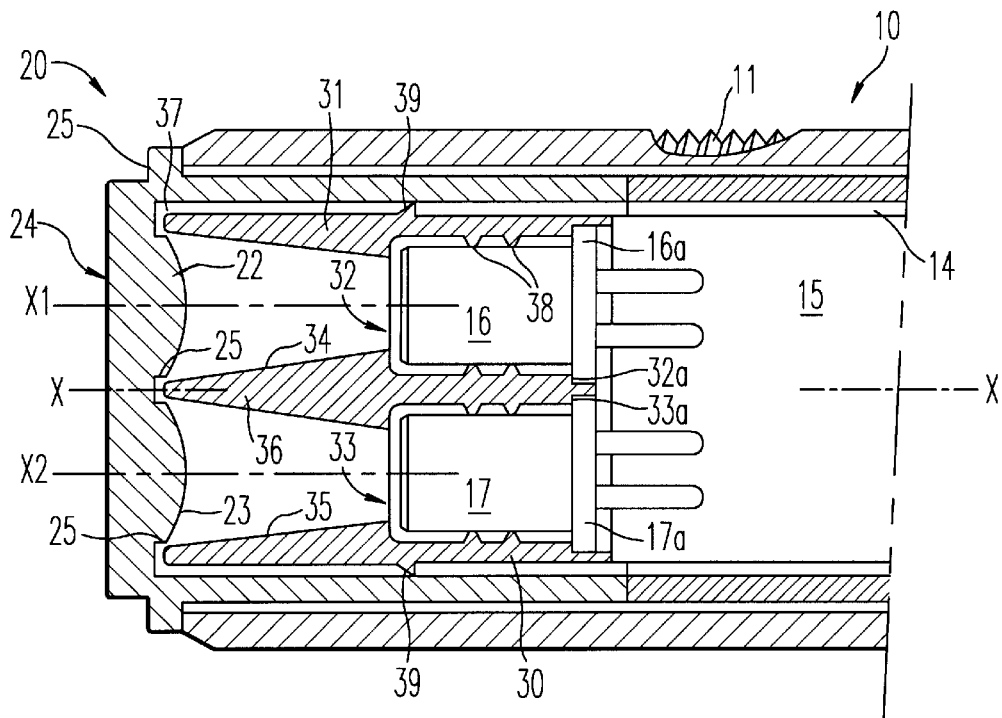
FIG. 3 shows in larger scale the front part of the detector of FIG. 1.

In this example, the optical part 20 is a cylindrical part in polycarbonate or polymethyl-methacrylate and comprises firstly a tubular wall 21 surrounding the body 31 of the support 30 and secondly a frontal wall 24 equipped with two lenses 22,23 respectively associated to the components 16,17. The optical part is inserted and stopped on the support 30 by means of appropriate hollowings 25 cooperating with frontal stopping elements of the support, namely a front edge 37 of the support, prolonging its envelope 31, and a front edge of its central wall 36 (see FIG. 3).

According to the invention, the centering support 30 presents firstly, in its internal positioning housings 32,33, internal surfaces ensuring the centering and sealing of the components 16,17 by resilient adjustment, with the possible presence of ribs or other similar elements 38 resulting from molding; the support presents secondly, on the external surface of its tubular body 31, a flexible circular sealing flange 39 applied against the internal surface 26 of the tubular wall 21. The expression "flange" is here understood to designate any element of annular shape provided on the outside of the body 31. The support 30 is advantageously an elastomer part resulting from molding with the centering and sealing elements 38 and the flexible flange 39. It will be noted that the rigid flanges 16a,17a of the optical components 16,17 are stopped on shoulders 32a,33a of the support 30.

At assembly, after the transmitter components 16 and the receiver components 17 are inserted in the support and soldered to the printed circuit 15, the assembly, consisting of the optical part 20 and the centering support 30 equipped with the components and linked to the printed circuit, is introduced in the inner volume 14 of the casing 10, until the rim 27 of the optical part 20 is stopped against the front edge 18 of the casing. The inner volume 14 of the casing is then filled with resin from the rear, making it possible to bury the electronic circuit and to fix both the support 30 to the optical part 20 and the optical part 20 to the casing 10; the presence of the elastomer flange 39 and the resilient adjustment of the housings 32,33 and/or of their ribs or similar elements 38 on the components prevents the danger of excess resin flowing towards the openings 34,35. In addition, water is prevented from penetrating the openings 34,35 by the flange 39 and adjustment means such as the elements 38.

I claim:

1. Photoelectric detector comprising in a casing:
   an electronic circuit on one edge of which is fixed at least one transmitter or receiver optical component of determined optical axis,
   an optical unit including firstly a centering support of the component, which said support is equipped with at least one internal housing in which the component is housed, and secondly an optical part comprising a frontal wall equipped with at least one lens centered on the optical axis of the component,
   the casing enveloping the electronic circuit and the optical unit, the latter being introduced in the casing by stopping a rim of the optical part against a front edge of the casing,
   characterized in that:
   the centering support of the component is a part molded in elastomer housed in a tubular wall of the optical part and having on its external surface a flexible sealing flange created by molding and applied against the internal surface of the tubular wall of the optical part.

2. Photoelectric detector according to claim 1, characterized in that the optical part is applied firstly on frontal stopping elements of the centering support and secondly on the front edge of the casing.

3. Photoelectric detector according to claim 1, characterized in that the optical component is adjusted and maintained resiliently in the housing of the support by the housing internal surface's own resilience.

4. Photoelectric detector according to claim 1, characterized in that the centering support presents, in its internal housing, at least one mold-formed element for resilient centering and sealing of the component.

* * * * *